United States Patent [19]

Joyner et al.

[11] Patent Number: 5,440,132

[45] Date of Patent: Aug. 8, 1995

[54] SYSTEMS AND METHODS FOR CONTROLLING THE TEMPERATURE AND UNIFORMITY OF A WAFER DURING A SIMOX IMPLANTATION PROCESS

[75] Inventors: Keith A. Joyner, Richardson, Tex.; James B. Hollingsworth, Woodland Park, Colo.

[73] Assignee: Texas Instruments Incorporated, Dallas, Tex.

[21] Appl. No.: 220,308

[22] Filed: Mar. 30, 1994

[51] Int. Cl.⁶ ............................................. H01J 37/317
[52] U.S. Cl. ............................. 250/492.21; 250/492.3
[58] Field of Search ............. 250/492.2, 492.21, 493.1, 250/492.3, 492.1, 491.1, 442.11

[56] References Cited

U.S. PATENT DOCUMENTS 4,831,270  5/1989  Weisenberger ................. 250/492.21
5,084,624  1/1992  Lamure et al. .................. 250/492.21

Primary Examiner—Jack I. Berman
Assistant Examiner—James E. Beyer
Attorney, Agent, or Firm—John D. Crane; James C. Kesterson; Richard L. Donaldson

[57] ABSTRACT

An implantation system (10) is provided that comprises a rotating drum (12) which holds a wafer chuck (28) which in turn holds a semiconductor wafer (26). The wafer chuck (28) rotates during the implantation of oxygen from an oxygen beam (24) created by a beam generator (22). The wafer chuck (28) is rotated via shaft (30) from a motor (32). The wafer chuck (28) also holds a thermal reflector (36) which allows for control of the temperature of the wafer during the implantation process.

20 Claims, 2 Drawing Sheets

SYSTEMS AND METHODS FOR CONTROLLING THE TEMPERATURE AND UNIFORMITY OF A WAFER DURING A SIMOX IMPLANTATION PROCESS

TECHNICAL FIELD OF THE INVENTION

The present invention relates in general to the field of semiconductor processing and more particularly to an improved system and method for controlling wafer temperature and uniformity during SIMOX implantation processes.

BACKGROUND OF THE INVENTION

In recent years, there has been an increasing interest in producing semiconductor-on-insulator (SOI) wafers for use as semiconductor substrates for the formation of integrated circuits. One method of forming an SOI substrate is by the use of the separation by implantation of oxygen (SIMOX) process. One step in the SIMOX process comprises the implantation of oxygen using a high current oxygen implanter that introduces oxygen beneath the surface of the substrate to create the buried semiconductor oxide layer. A later annealing step is used to repair implant damage performed during the implant process and to react the buried oxygen atoms with semiconductor atoms to form the buried oxide layer. SOI wafers formed using this process enjoy a variety of advantages over wafers comprising bulk semiconductor material. The quality of the SOI substrate formed using the SIMOX process is dependant on the temperature of the wafer during the process and the uniformity of the implantation across the wafer.

SUMMARY OF THE INVENTION

Accordingly, a need has arisen for a system and method for performing the SIMOX process to create SOI substrates which allows for the control of the temperature of the wafer during the SIMOX process and which provides for uniformity in the implantation of oxygen into the substrate.

In accordance with the teachings of the present invention, a system and method for creating SOI substrates is provided that substantially reduces or eliminates problems associated with prior methods of performing the SIMOX process.

According to one embodiment of the present invention, a semiconductor processing system is provided that comprises an oxygen beam generator, and a wafer chuck operable to hold a semiconductor wafer in a position so that the oxygen beam impacts on one surface of the wafer. The wafer chuck is constructed of a thermally reflective material positioned behind the semiconductor wafer. The system of the present invention further comprises a system for rotating the wafer chuck and the wafer during the implant process in order to insure uniformity of the implantation process.

BRIEF DESCRIPTION OF THE DRAWINGS

A more complete understanding of the advantages of the present invention may be acquired by referring to the FIGUREs wherein like reference numbers indicate like features and wherein.

DETAILED DESCRIPTION OF THE INVENTION

Figure 1:
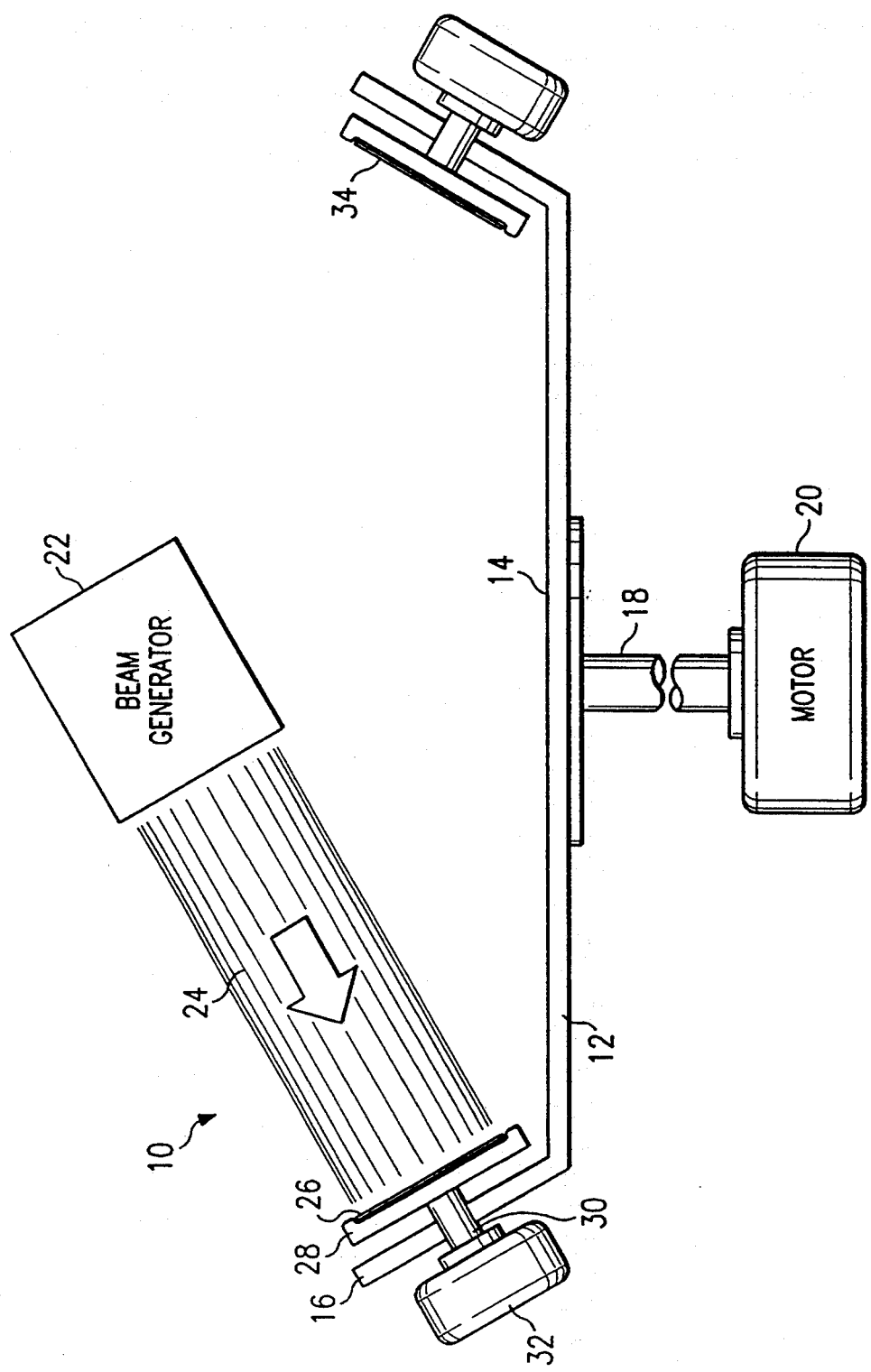
FIG. 1 is a schematic illustration of an oxygen implanting system constructed according to the teachings of the present invention.

Referring to FIG. 1, an implantation system indicated generally at 10 is shown. The system 10 comprises a rotating drum 12. Rotating drum 12 comprises a base 14 and a rim 16 which extends upwardly and outwardly from the base 14 at an angle as shown in FIG. 1. FIG. 1 is a cross-sectional illustration of system 10. In actuality, base 14 is a circular plate. Further, rim 16 forms an angled cylinder coupled at one edge to base 14. Base 14 and rim 16 may be formed as separate structures and joined or may be constructed from a single casting.

Drum 12 is coupled to a shaft 18 which is rotated by a motor 20. Motor 20 operates to rotate shaft 18 and drum 12 at a rotational speed on the order of 240 rotations per minute. A beam generator 22 is positioned above the center of drum 12. Beam generator 22 emits a beam of oxygen ions 24 which travel toward rim 16 and impact a wafer 26. Wafer 26 is held in position by a wafer chuck 28. Wafer chuck 28 is coupled to a shaft 30 which is rotated by a motor 32. A second wafer 34 is shown in FIG. 1 held in an identical configuration as wafer 26. In operation, a large number of wafers are positioned side-by-side around rim 16 and periodically rotate through the beam 24 as the drum 12 rotates during the implantation process.

The configuration shown in FIG. 1 is presented solely for the purpose of teaching advantages of the present invention and should not be construed to limit the scope of the invention to this or any particular configuration. For example, beam generator 22 may actually be located some distance from drum 12 and the beam 24 is routed to drum 12 and deflected appropriately when it reaches drum 12 so that the beam 24 strikes wafer 26 and the remaining wafers in drum 12. Further, other configurations of drum 12 are equally effective. For example, the subject wafers, such as wafer 26 may be disposed on the outside of a wheel with beam 24 striking the wafers from outside of the wheel as the wheel rotates. The teachings of the present invention are equally applicable to these and a variety of other configurations.

In general, implantation is a process in which ions such as the oxygen ions within beam 24 that have been accelerated to several thousand electron volts of energy are made to penetrate a solid surface such as silicon. Implantation is an alternative to diffusion for injecting impurities into a semiconductor layer. Unlike thermal processes, ion implantation produces the maximum concentration of implanted materials beneath the wafer surface. Because the implanted dopants are not generally in the proper lattice position after the implantation and are mostly electrically inactive, the use of a high temperature annealing process following implantation process is necessary. In the SIMOX process, this annealing process repairs damage to the crystal lattice in the surface layer and forms the buried insulator layer within semiconductor wafer 26.

The wafer temperature during the SIMOX process greatly influences the quality of the semiconductor material exposed on the outer surface of the implanted wafer after the SIMOX process is concluded. At low temperatures, the implantation process destroys the lattice structure of the semiconductor material in the outer areas of the semiconductor substrate. As the wafer temperature increases to on the order of 610° C., the crystal lattice of the outer semiconductor material repairs itself during the SIMOX process.

In conventional implantation systems, the wafer temperature is determined by ion beam parameters such as beam energy and beam current. However, the beam energy typically must be set to produce the deepest buried oxide layer. Accordingly, only the beam current is left as a means to control the implant temperature. Because of the constraints of machine operation and desired uniformity, the beam current can only be adjusted over a relatively narrow range resulting in a narrow range of operating temperatures. As such, there is very little control over the wafer temperature in conventional implantation systems. Accordingly, as will be discussed herein, the implantation process of the present invention includes the placement of a thermally reflective material behind the wafer 26. By varying the thermally reflective properties of this material, the implant temperature of the wafer 26 can be controlled.

Because of non-uniformity of the beam 24, the thickness of the buried oxide layer and the outer silicon layer may vary on substrate 26. Other material properties such as dislocation density also may vary due to variations in the density of the beam 24. Conventional systems use a variety of methods to make the beam 24 more uniform or to manually rotate the wafers during the SIMOX process. However, the SIMOX process occurs at a very high temperature in a very high vacuum which makes the manual rotation of wafers extremely difficult. Accordingly, the implantation system 10 of the present invention includes a system for automatically rotating the wafer 26 during the implantation process. The motor 32 operates to continuously rotate the wafer 26 so that every portion of the wafer 26 receives an equal dose from the beam 24 during the entire implantation process. Similar motors or other wafer chuck rotation systems are used for each wafer chuck in system 10.

Figure 2:
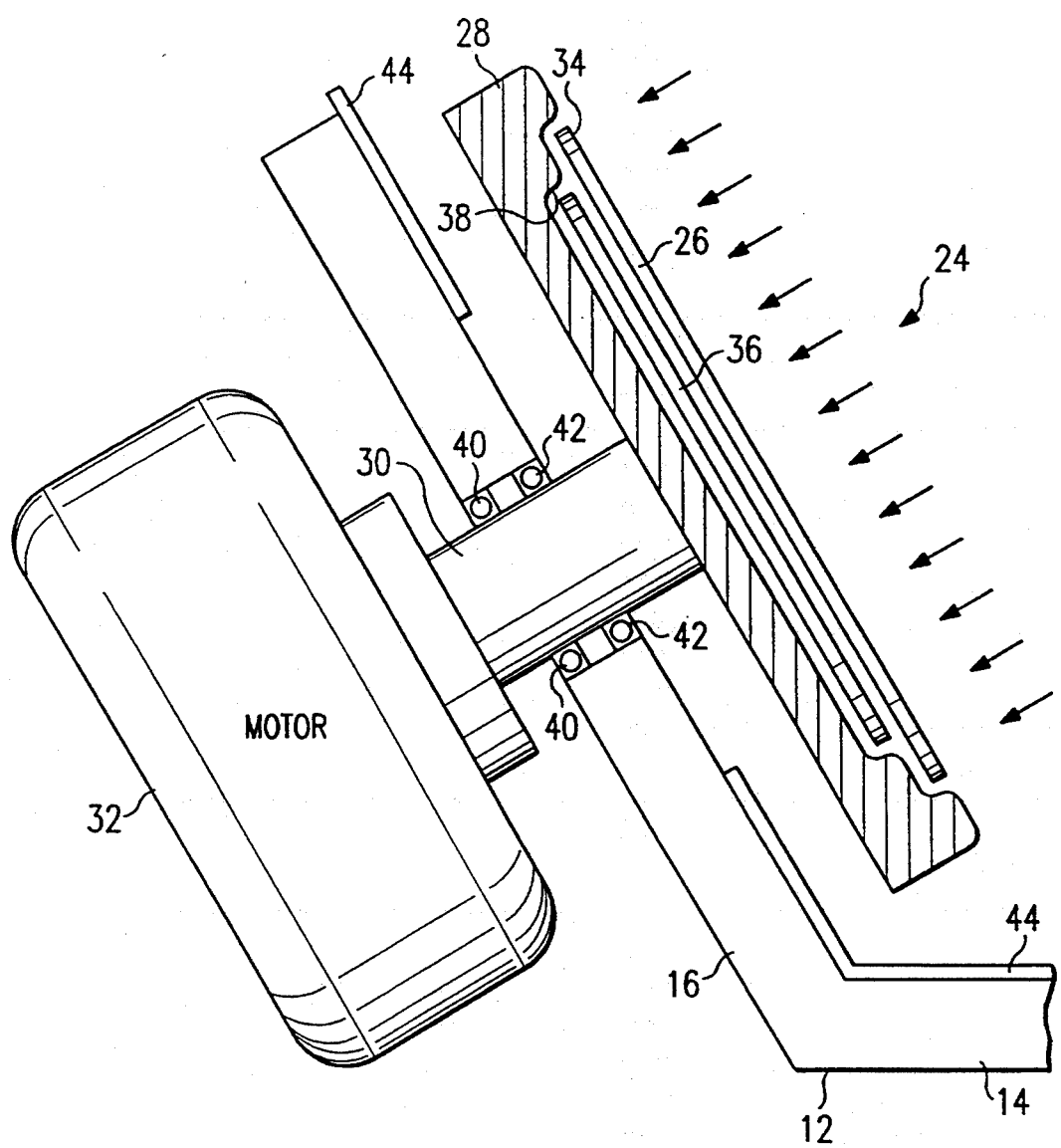
FIG. 2 is a schematic illustration of one portion of an implantation system constructed according to the teachings of the present invention illustrating a wafer chuck constructed according to the teachings of the present invention.

FIG. 2 is a more detailed schematic illustration of the system of the present invention used to hold and rotate semiconductor wafer 26. Referring to FIG. 2, the wafer chuck 28 holds the semiconductor wafer 26 in an outer indentation 34. The wafer chuck 28 also holds a thermal reflector 36 in an inner indentation 38 shown in FIG. 2. Thermal reflector 36 comprises a piece of material which will operate to reflect thermal energy emitted from the back side of wafer 26 and return that energy to wafer 26 to raise the temperature of wafer 26 during the implantation process. Thermal reflector 36 may comprise, for example, a piece of aluminum which will provide for a very high level of reflectivity. In order to accomplish other wafer temperatures during the implantation process, thermal reflector 36 may comprise other materials such as silicon, germanium, stainless steel, tungsten, carbon, gallium arsenide, or a piece of glass that has a mirror finish. Further, materials such as stainless steel may be rough-polished or electro-polished to vary the reflectivity of the material. Using these various materials, the temperature of wafer 26 during the implantation process can be adjusted so that the implantation process can be controlled to a greater degree than previously possible. The thermal reflector 36 can be thermally isolated from wafer chuck 28 or thermally bonded to wafer chuck 28 for further control of the temperature of wafer 26.

The wafer chuck 28 is held inwardly from the rim 16 by a shaft 30 that is coupled to a motor 32. The shaft 30 is held movably with respect to rim 16 by bearings 40 and 42 shown in FIG. 2.

The oxygen beam 24 impacts the outer surface of wafer 26 and also impacts to some degree the inner surfaces of the implantation system 10. As such, the exposed surfaces of rim 16 are covered with a polysilicon protective layer 44 shown in FIG. 2.

The typical implantation process occurs over a time period on the order of five to six hours. As such, the rotation of wafer 26 by motor 32 need not be very fast. In fact, while a continuous rotation is available from motor 32, a series of automatic discreet step rotations can be accomplished in a similar manner. For example, the rotation of rim 16 could be used to trip a mechanically driven rotation scheme attached to shaft 30. In a similar manner, a mechanical clock-winding could be used in place of motor 32. In addition, the shaft 30 could be replaced by electrostatic or magnetic coupling to prevent wear to the mechanical systems due to high temperature. The automatic rotation of wafer 26 by any suitable automatic wafer chuck rotation mechanism will accomplish the aims of the present invention which is to provide for a uniform implantation of oxygen from the somewhat non-uniform oxygen beam 24.

Although the present invention has been described with reference with the alternatives described previously, it should be understood that these alternatives are presented solely as examples for purposes of teaching the advantages of the present invention and any means of automatically rotating a wafer during the implantation process should be construed to fall within the scope and spirit of the present invention.

One technical advantage of the present invention is due to the fact that because of the rotation of the wafer 26, the complex methods of providing for beam uniformity may be reduced or eliminated altogether. For example, methods of providing for constant beam profiles have an undesired side effect of causing beam density roll-off at the edges of the beam. Alternatively, if the subject wafer is rotated during the implantation process, a linear beam profile could be used with a higher beam concentration at the lower boundaries of beam 24. In this configuration, there is little or no beam roll-off at the edges and the entire wafer 26 will receive a uniform dose from the beam 24 due to the rotation of wafer 26.

While the present invention is described with reference to an ion implantation process, the teachings of the present invention are not limited to this process. For example, the temperature control benefits of the present invention could also be implemented by placing thermally reflective material proximate wafers that are undergoing plasma processes or rapid thermal processing (RTP). In RTP systems, annular reflective materials could be used to prevent the temperature rolloff near the edges of subject wafers. The teachings of the present invention are equally applicable in any process environment where energy used in the process is impinging on the subject wafer from substantially one direction.

In summary, an implantation system is provided that provides for control over the wafer temperature during a SIMOX implantation process. Further, problems associated with non-uniformity of the implantation beam are solved by automatically rotating the subject wafer during the implantation process to provide for an even dose of implantation across the surface of the wafer over the entire implantation process.

Although the present invention has been described in detail, it should be understood that various changes, alterations and changes may be made to the systems described herein without departing from the spirit and scope of the present invention which is solely defined by the appended claims.

What is claimed is:

1. A system for implanting ions in a semiconductor wafer, comprising:
    a beam generator operable to generate a beam of ions;
    a rotating drum having a rim and a base;
    a wafer chuck disposed proximate the rim of the drum and rotatably fixed with respect to the rim such that the wafer chuck passes through the beam generated by the beam generator as the drum rotates;
    a wafer chuck rotation mechanism coupled to the wafer chuck and operable to turn the wafer chuck during the implantation process; and
    a thermal reflector disposed proximate the wafer chuck and operable to reflect thermal energy emitted by a semiconductor wafer disposed in the wafer chuck.

2. The implantation system of claim 1 wherein the thermal reflector comprises aluminum.

3. The implantation system of claim 1 wherein the thermal reflector comprises silicon.

4. The implantation system of claim 1 wherein the thermal reflector comprises germanium.

5. The implantation system of claim 1 wherein the thermal reflector comprises steel.

6. The implantation system of claim 1 wherein the thermal reflector comprises tungsten.

7. The implantation system of claim 1 wherein the thermal reflector comprises carbon.

8. The implantation system of claim 1 wherein the thermal reflector comprises mirror.

9. The implantation system of claim 1 wherein the wafer chuck rotator comprises a motor and a shaft coupling the motor to the wafer chuck.

10. The implantation system of claim 9 and further comprising bearings disposed between the shaft and the rim.

11. The implantation system of claim 1 and further comprising a motor coupled to the drum and operable to rotate the drum relative to the ion beam during the implantation process.

12. The implantation system of claim 1 wherein the wafer chuck rotation mechanism comprises a system operable to rotate a wafer disposed in the wafer chuck in discreet intervals responsive to the rotation of the rim and drum.

13. The implantation system of claim 1 wherein the wafer chuck rotation mechanism comprises a spring driven clock winding system operable to unwind and rotate the wafer chuck during the implantation process.

14. A system for performing a SIMOX implantation process on a semiconductor substrate to create a silicon-on-insulator substrate comprising:
    a rotating drum;
    an oxygen beam generator fixed with respect to the rotating drum and operable to generate a beam of high energy oxygen ions;
    a plurality of wafer chucks disposed on the periphery of the rotating drum such that the wafer chucks periodically pass through the beam generated by the beam generator;
    a motor coupled to the drum and operable to rotate the drum; and
    a thermal reflector disposed in each of the plurality of wafer chucks and operable to reflect thermal energy emitted by a semiconductor substrate placed in each of the thermal chucks back to each of the semiconductor substrates.

15. The system of claim 14 and further comprising a wafer chuck rotation mechanism coupled to each of the wafer chucks and operable to rotate the wafer chucks during the implantation process.

16. The system of claim 14 wherein the thermal reflector comprises aluminum.

17. An ion implantation process for forming a silicon-on-insulator substrate comprising the steps of:
    generating a beam of oxygen ions;
    disposing a plurality of semiconductor substrates on wafer chucks;
    disposing the wafer chucks around the periphery of a drum;
    rotating the drum such that the wafer chucks periodically pass through the oxygen beam;
    rotating the wafer chucks with respect to the drum such that the position of the substrate with respect to the beam changes each time a particular semiconductor substrate passes through the beam as the drum rotates; and
    reflecting thermal energy emitted by a semiconductor substrate during the implantation process back to the semiconductor substrate using a thermal reflector material.

18. The method of claim 17 wherein the step of reflecting thermal energy comprises the step of reflecting thermal energy using a thermal reflector comprising aluminum.

19. The method of claim 17 wherein the step of reflecting thermal energy comprises the step of reflecting thermal energy using a thermal reflector made of a thermally reflecting material selected from the group consisting of silicon, germanium, stainless steel, tungsten, carbon, gallium arsenide and glass with a mirror finish.

20. The method of claim 17 additionally including the step of selecting the polish finish of the thermal reflector to provide a different thermal reflectivity therefor.

* * * * *